United States Patent [19]

Hsieh et al.

[11] Patent Number: 4,786,580

[45] Date of Patent: Nov. 22, 1988

[54] METHOD OF DEVELOPING IMAGED DIAZO MATERIAL WITH PROPANOL CONTAINING DEVELOPER COMPOSITION

[75] Inventors: Shane Hsieh, Bridgewater; Wayne A. Mitchell, Bound Brook, both of N.J.

[73] Assignee: Hoechst Celanese Corporation, Somerville, N.J.

[21] Appl. No.: 566,125

[22] Filed: Dec. 27, 1983

[51] Int. Cl.⁴ .......................... G03F 7/08; G03C 5/18; G03C 5/34

[52] U.S. Cl. ..................................... 430/325; 430/149; 430/302; 430/309; 430/331

[58] Field of Search ............... 430/309, 325, 326, 302, 430/331

[56] References Cited

U.S. PATENT DOCUMENTS

| | | | |
|---|---|---|---|
| 2,754,279 | 7/1956 | Hall | 430/309 |
| 3,475,171 | 10/1969 | Alles | 430/331 |
| 3,682,641 | 8/1972 | Casler et al. | 430/331 |
| 3,745,028 | 7/1973 | Rauner | 430/331 |
| 3,868,254 | 2/1975 | Wemmers | 430/331 |
| 4,186,006 | 1/1980 | Kobayashi et al. | 430/331 |
| 4,271,261 | 6/1981 | Shimizu et al. | 430/309 |
| 4,308,340 | 12/1981 | Walls | 430/331 |
| 4,370,406 | 1/1983 | Jones | 430/309 |
| 4,381,340 | 4/1983 | Walls | 430/302 |
| 4,396,703 | 8/1983 | Matsumoto et al. | 430/331 |
| 4,416,976 | 11/1983 | Schell | 430/331 |

*Primary Examiner*—Charles L. Bowers, Jr.
*Attorney, Agent, or Firm*—Richard S. Roberts

[57] ABSTRACT

The invention provides a method for developing negative working photographic elements using an aqueous developer comprising
(a) a solvent composition consisting essentially of
  (i) n-propanol or isopropanol; and
  (ii) a glycol ether or acetate
(b) a salt which is preferably magnesium sulfate; and
(c) an ethoxylated alkyl phenol type non-ionic surfactant.

10 Claims, No Drawings

METHOD OF DEVELOPING IMAGED DIAZO MATERIAL WITH PROPANOL CONTAINING DEVELOPER COMPOSITION

BACKGROUND OF THE INVENTION

The present invention relates to a developer composition for photographic elements comprising photosensitive coatings on substrates, or more particularly to developer compositions for removing the non-image areas of exposed negative working lithographic printing plates.

In the past, various methods of developing printing plates have been employed. Such methods include the use of compositions containing organic solvents, surfactants, salts, acids and other art recognized materials in solution.

It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of organic solvents as components of the developer solution is very important. If the selected solvent is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly negative working plates, nonimage areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water soluble low boiling point solvents for example, as used in the developer described in U.S. Pat. No. 3,954,472, produces the problems of working sanitation, hazards due to low flash point, and pollution. A reduction of the concentration of these water soluble low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling point solvents, an adjuvant organic solvent is sometime added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts. Sensitizers, binders and printing plates employing aromatic diazonium compounds are described in U.S. Pat. Nos. 3,175,906; 3,046,118; 2,063,631; 2,667,415; 3,867,147 and 3,679,419.

Typical prior art developer compositions are described in U.S. Pat. Nos. 2,754,279; 4,381,340 and German OLS No. 2,216,419.

The present invention improves upon the aforementioned drawbacks of other lithographic developers.

It is an object of this invention to provide a developer for lithographic printing plates having resin binders in their photosensitive coatings, which will enable the operator to prepare a plate substantially free from objectionable redeposit, and further having a reduced toxicity and higher flash point while simultaneously achieving commercially acceptable removal of non-imaged areas.

SUMMARY OF THE INVENTION

The invention provides a method for developing imagewise light exposed negative working photographic elements by contacting said exposed element with an aqueous developer comprising:
(a) a solvent composition consisting essentially of
   (i) at least one alcohol selected from the group consisting of n-propanol and isopropyl alcohol; and
   (ii) at least one component selected from the group consisting of propylene glycol mono methyl ether, propylene glycol mono propyl ether, ethylene glycol monophenyl ether, diethylene glycol mono ethyl ether, and diethylene glycol acetate, and
(b) at least one salt selected from the group consisting of lithium, magnesium, potassium, sodium and ammonium sulfates, phosphates and nitrates; and
(c) at least one non-ionic surfactant selected from the group consisting of ethoxylated alkyl phenols.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3003 and Alcoa 1100, which may or may not have been pretreated by standard graining and/or etching and/or anodizing techniques as are well know in the art, and also may or may not have been treated with a composition, such as polyvinyl phosphonic acid, suitable for use as a hydrophilizing layer for lithographic plates is coated with a radiation sensitive diazo containing composition. Such diazo containing composition may also contain binding resins, such as polyvinyl formal resins, colorants, acid stabilizers, surfactants, exposure indicators or other (art recognized ingredients).

The photosensitive sheet material is then exposed to a radiation source through a mask or transparency, and the exposed sheet then developed for removal of unexposed photosensitive materials.

The mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid consensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

The present invention provides a method for developing such exposed photosensitive elements by contacting them, to remove the unexposed non-image areas, using a developer which contains the aforementioned ingredients in an aqueous mixture. These ingredients include an alcohol component, a glycol derivative, a salt as described and a surfactant member. The resultant developer has a flash point which is preferably at least 100° F. and more preferably at least 105° F.

The alcohol component is preferably either n-propanol or isopropyl alcohol with n-propanol being more preferred. This component is present in an amount of from about 1% to about 28% by weight of the developer composition. A more preferred range is from about 3.5% to about 13% and most preferably from about 5% to about 10%.

The developer also contains at least one and preferably at least two glycol derivative components selected from the group consisting of propylene glycol mono methyl ether, propylene glycol mono propyl ether, ethylene glycol monophenyl ether, diethylene glycol mono ethyl ether, and diethylene glycol acetate.

In the preferred embodiment this glycol derivative component is present in the developer in an amount of from about 5 to about 30% or more preferably from about 10 to about 20%. When more than one such glycol derivative component is present in the developer, each may be present in an amount of from about 1% to about 25% or more preferable from about 5 to about 20%. Particularly preferred combinations include propylene glycol mono-methyl ether/propylene glycol mono propyl ether; and propylene glycol mono methyl ether/ethylene glycol mono-ethyl ether.

The composition also contains at least one salt selected from the group consisting of lithium, magnesium, potassium, sodium and ammonium sulfates phosphates and nitrates. The salt component is present in the developer in the amount of from about 1% to about 10% by weight of the developer. Preferably it is present in an amount of from about 5% to about 10% and more preferably from about 5% to about 8%. The most preferred salt is magnesium sulfate heptahydrate.

The composition further contains at least one nonionic surfactant selected from the group consisting of ethoxylated alkyl phenols. The surfactant component is present in the developer in an amount of from about 0.1 to about 2% by weight of the developer, preferably from about 0.5% to about 1%. Suitable surfactants useful within the context of the invention include those which have a very high hydrophilic-lipophilic balance (HLB) due to ethoxylation. This results in the absence of a cloud point which in turn contributes to tendency to undesirable phasing of the processing solution. Preferred are nonionics with an HLB of greater than about 17. There is no upper limit. A general formula of useful, perferred surfactants follows:

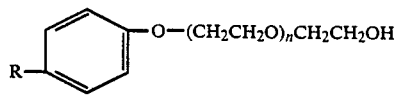

$$n = 4\text{--}40$$
$$\text{wherein } R = H$$
$$= OH$$
$$= C_8H_{17}$$
$$= C_9H_{19}$$
$$= C_{10}H_{21} \text{ and}$$
$$= CH_3(CH_2)_m-O-(CH_2CH_2O)_nCH_2CH_2OH$$
$$\text{wherein } m = 9\text{--}30$$
$$n = 4\text{--}20$$

Preferred surfactant species include:
nonylphenoxy polyoxyethylene ethanol
polyoxyethylene monosorbitan oleate
tridecylalcohol polyoxyethylene ethanol
isooctyl phenoxy polyoxyethylene ethanol
decyl alcohol polyoxyethylene ethanol
decylphenoxy polyoxyethylene ethanol
isooctyl phenoxy polyoxyethylene ethanol
isooctyl phenoxy ethylene ethanol These surfactants are more fully described in U.S. Pat. No. 4,381,340 which is incorporated herein by reference.

In the preferred embodiment, the developer of the present invention perferably contains optional minor amounts of ingredients which aid in the prevention of scumming in the non-image areas of the element and can further render the background areas more hydrophilic when the element is a lithographic printing plate. Such ingredients include film formers such as polyethylene glycol, polyvinyl pyrrolidone and starch which lessen the tendency of removed plate coating to be re-deposited back onto the plate surface and which allows the developer to finish and preserve the plate as well.

The following non-limiting examples serve to illustrate the invention.

EXAMPLE 1

An ENCO ® N-3 negative working printing plate is imagewise exposed to actinic radiation. The thusly exposed plate is then washed with the following developer composition:

|  | Weight % |
| --- | --- |
| Water | 64.1 |
| n-propanol | 8.4 |
| mono methyl ether of propylene glycol | 8.5 |
| mono propyl ether of propylene glycol | 9.3 |

| | Weight % |
|---|---|
| Carbowax 200 (polyethylene glycol) | 0.7 |
| mono sodium phosphate mono-hydrate | 1.0 |
| magnesium sulfate hepta-hydrate | 7.2 |
| Trycol OP 407 (tridecylalcohol polyoxyethylene ethanol) | 0.8 |

The plate develops cleanly without noticeable background scumming or re-deposit of removed plate coatings.

EXAMPLE 2

Example 1 is repeated except the following developer is used:

| | Weight % |
|---|---|
| Water | 63.3 |
| n-propanol | 9.1 |
| mono methyl ether of propylene glycol | 13.7 |
| mono phenyl ether of propylene glycol | 2.7 |
| PVP K15 (polyvinyl pyrrolidone) | 1.5 |
| Carbowax 200 (polyethylene glycol) | 0.8 |
| mono sodium phosphate mono-hydrate | 1.0 |
| magnesium sulfate hepta-hydrate | 7.2 |
| Trycol OP 407 (tridecylalcohol polyoxyethylene ethanol) | 0.7 |

Similar results are noticed.

EXAMPLE 3

Example 1 is repeated except the following developer is used:

| | Weight % |
|---|---|
| Water | 64.4 |
| n-propanol | 9.3 |
| mono methyl ether of propylene glycol | 13.9 |
| mono phenyl ether of propylene glycol | 2.8 |
| Carbowax 200 (polyethylene glycol) | 0.7 |
| mono sodium phosphate mono-hydrate | 1.0 |
| magnesium sulfate hepta-hydrate | 7.2 |
| Trycol OP 407 (tridecylalcohol polyoxyethylene ethanol) | 0.7 |

Similar results are noticed.

What is claimed:

1. A method for developing imagewise light exposed negative working diazonium salt sensitized photographic elements by contacting said exposed element with an aqueous developer solution comprising:
   (a) a solvent solution composition consisting essentially of, in admixture:
      (i) from about 1% to about 28% by weight of the developer of at least one alcohol selected from the group consisting of n-propanol and isopropyl alcohol; and
      (ii) from about 5% to about 30% by weight of the developer of at least one component selected from the group consisting of propylene glycol mono methyl ether, propylene glycol mono propyl ether, ethylene glycol monophenyl ether, diethylene glycol mono ethyl ether, and diethylene glycol acetate, and
   (b) from about 1% to about 10% by weight of the developer of at least one salt selected from the group consisting of lithium magnesium potassium sodium and ammonium sulfates, phosphates and nitrates; and
   (c) from about 0.1% to about 2% by weight of the developer of at least one non-ionic surfactant selected from the group consisting of ethoxylated alkyl phenols.

2. The method of claim 1 wherein said component (i) is n-propanol.

3. The method of claim 1 wherein said component (ii) comprises propylene glycol mono-methyl ether and propylene glycol monopropyl ether.

4. The method of claim 1 wherein said component (b) comprises magnesium sulfate.

5. The method of claim 1 wherein said surfactant is tridecylalcohol polyoxyethylene ethanol.

6. The method of claim 1 wherein component (i) comprises n-propanol; component (ii) comprises propylene glycol monomethyl ether and propylene glycol mono propyl ether; component (b) comprises magnesium sulfate; and component (c) comprises tridecylalcohol polyoxyethylene ethanol.

7. The method of claim 6 wherein said component (i) is present in an amount of from about 1% to about 28% by weight of said developer; said component (ii) is present in an amount of from about 5% to about 30%; said component (b) is present in an amount of from about 1% to about 10%; and said component (c) is present in an amount of from about 0.1% to about 2%.

8. The method of claim 7 wherein said component (i) is present in an amount of from about 3.5% to about 13% by weight of the developer.

9. The method of claim 1 further comprising one or more compounds selected from the group consisting of polyethylene glycol, polyvinyl pyrrolidone and starch.

10. The method of claim 1 wherein said surfactant has the formula:

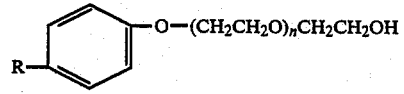

n = 4–40
wherein R = H
       = OH
       = $C_8H_{17}$
       = $C_9H_{19}$
       = $C_{10}H_{21}$ and
       = $CH_3(CH_2)_m-O-(CH_2CH_2O)_nCH_2CH_2OH$
wherein m = 9–30
        n = 4–20.

* * * * *